(12) United States Patent
Popescu et al.

(10) Patent No.: US 12,019,701 B2
(45) Date of Patent: Jun. 25, 2024

(54) COMPUTER ARCHITECTURE FOR STRING SEARCHING

(71) Applicant: International Business Machines Corporation, Armonk, NY (US)

(72) Inventors: Octavian Popescu, Katonah, NY (US); Vadim Sheinin, Yorktown Heights, NY (US); Bijan Davari, Mahopac, NY (US); Gheorghe Almasi, Ardsley, NY (US)

(73) Assignee: International Business Machines Corporation, Armonk, NY (US)

( * ) Notice: Subject to any disclaimer, the term of this patent is extended or adjusted under 35 U.S.C. 154(b) by 464 days.

(21) Appl. No.: 17/386,477

(22) Filed: Jul. 27, 2021

(65) Prior Publication Data
US 2023/0036196 A1    Feb. 2, 2023

(51) Int. Cl.
*G06F 17/14*    (2006.01)
*G06F 16/31*    (2019.01)

(52) U.S. Cl.
CPC .......... *G06F 17/144* (2013.01); *G06F 16/328* (2019.01)

(58) Field of Classification Search
CPC ... G06F 16/328; G06F 16/3344; G06F 17/144
(Continued)

(56) References Cited

U.S. PATENT DOCUMENTS 6,718,536 B2    4/2004    Dupaquis
7,991,987 B2    8/2011    Cabot
(Continued)

FOREIGN PATENT DOCUMENTS

WO    WO2006058476    6/2006
WO    WO2018232554    12/2018

*Primary Examiner* — Hung T Vy
(74) *Attorney, Agent, or Firm* — Randy Tejeda

(57) ABSTRACT

An embodiment of the present invention is a prime representation data structure in a computer architecture. The prime representation data structure has a plurality of records where each record contains a prime representation and where the prime representation is a product of two or more selected prime factors. Each of the selected prime factor associated with an n-gram of a domain representation of a domain string. The domain representation of the domain string is a domain string of ordered, contiguous domain characters. The n-gram being a subset of n number of the ordered, contiguous domain characters in the domain string. The computer architecture performs string searching and includes one or more central processing units (CPUs) with one or more operating systems, one or more input/output device interfaces, one or more memories, and one or more input/output devices. The architecture further includes the prime representation data structure, one or more prime target query data structures and a search process performed by one or more of the CPUs. The CPUs can be organized in a hierarchical structure. The prime target query data structure has one or more target prime queries. Each target prime query is the product of one or more target selected prime factors. Each target selected factor is associated with a target n-gram of a target domain representation of a target domain string. The search process, performed by one or more of the CPUs, determines whether one or more of the target selected prime factors is common with one of the selected prime factors. By performing this efficient testing, the computer system can determine if one or more small strings are included in one or more large strings.

20 Claims, 12 Drawing Sheets

(58) Field of Classification Search
USPC .......................................................... 707/600
See application file for complete search history.

(56) References Cited

U.S. PATENT DOCUMENTS

| | | | |
|---|---|---|---|
| 9,311,423 B1* | 4/2016 | Brown | G06F 16/285 |
| 9,330,168 B1* | 5/2016 | Brown | G06F 16/355 |
| 9,563,721 B2 | 2/2017 | Anderson | |
| 9,645,828 B2 | 5/2017 | Sugiyama et al. | |
| 9,740,679 B2 | 8/2017 | Galle | |
| 2016/0179473 A1* | 6/2016 | Bos | G06F 9/3001 |
| | | | 380/28 |
| 2016/0182236 A1* | 6/2016 | Peeters | H04L 9/302 |
| | | | 380/28 |
| 2019/0363871 A1* | 11/2019 | Cheon | H04L 9/304 |
| 2019/0386814 A1* | 12/2019 | Ahmed | H04L 9/008 |
| 2020/0050639 A1 | 2/2020 | Barouni Ebrahimi et al. | |

* cited by examiner

COMPUTER ARCHITECTURE FOR STRING SEARCHING

BACKGROUND

The present invention relates to a computer architecture for string searching. More specifically, the invention relates to a computer architecture for searching the occurrences of a string of relatively short length (short strings, SS) in one or more databases/depositories of long length strings (long strings, LS).

Finding occurrences of SSs in LSs, particularly in large databases of LSs, has applications in many fields, like artificial intelligence, that further include: language translation, image recognition, DNA analysis, design of pharmaceuticals, disease studies, etc. The prior art has multiple approaches to doing these string searches.

Unfortunately, these techniques, operating on general purpose computers, are sometimes ill equipped to perform these complex string searches quickly and efficiently. Accordingly, efforts in areas relying on these complex string searches become expensive in computer time and in some cases impossible or impractical to do. Further, systems which have large database(s) of LSs become inoperable and/or non-feasible when the size of the database(s) and/or length of the LSs increases. These problems compound when the string search must be performed fast and accurately.

For example, there can be an extremely large number of characters/letters in a LS, e.g., a natural language LS. This large number problem (LN) is illustrated, for example, by reducing the entire works of Shakespeare into a single LS that includes all the characters/letters in all of Shakespeare's works. Other aspects of the problem occur when the LS is shortened to contain all the characters/words in just one scene in a Shakespeare work but the size of the database increases to accommodate a large number of scenes and/or the database needs to include additional searchable works like those of Milton.

Other problems occur when searching in a natural language text or domain, like English, when characters and/or sequences of characters and/or contiguous sets of characters are repeated in the one or more of the long strings. This character repetition problem (CR) can confuse many search engines to result in false matches/occurrences.

Further, the performance of even simple operations on these LSs can be a very costly and time intensive effort, e.g., in terms of computer time and resources. This resource use problem (RU) can make these searches expensive, impractical, or inoperable. For example, a slow and/or inefficient search algorithm in a natural language translation system makes the system impractical and/or inoperable because the translation will be too slow and/or inaccurate to use in translating real time conversation or speech.

There is a need for a computer architecture that can perform rapid, efficient, and accurate searches of large databases of long strings to determine which, if any, of the large strings in databases contain one or more occurrences of short strings. There is need for these computer architectures operate in the domain of natural language (NL).

SUMMARY

An embodiment of the present invention is a prime representation data structure in a computer architecture. The prime representation data structure has a plurality of records where each record contains a prime representation and where the prime representation is a product of two or more selected prime factors. Each of the selected prime factor is associated with an n-gram of a domain representation of a domain string. The domain representation of the domain string is a domain string of ordered, contiguous domain characters. The n-gram is a subset of n number of the ordered, contiguous domain characters in the domain string.

Other embodiments of the invention are a string searching computer architecture. The architecture includes one or more central processing units (CPUs) with one or more operating systems, one or more input/output device interfaces, one or more memories, and one or more input/output devices. The architecture further includes the prime representation data structure, one or more prime target query data structures and a search process performed by one or more of the CPUs. The CPUs can be organized in a hierarchical structure. The prime target query data structure has one or more target prime queries. Each target prime query is the product of one or more target selected prime factors. Each target selected factor is associated with a target n-gram of a target domain representation of a target domain string. The search process, performed by one or more of the CPUs, determines whether one or more of the target selected prime factors is common with one of the selected prime factors.

Optimizations of the search process and methods included in the computer architecture are also described.

BRIEF DESCRIPTION OF THE DRAWINGS

Various embodiments of the present invention will be described below in more detail, with reference to the accompanying drawings, now briefly described. The Figures show various architectures, apparatus, structures, and related method steps of the present invention.

DETAILED DESCRIPTION

Figure 1:
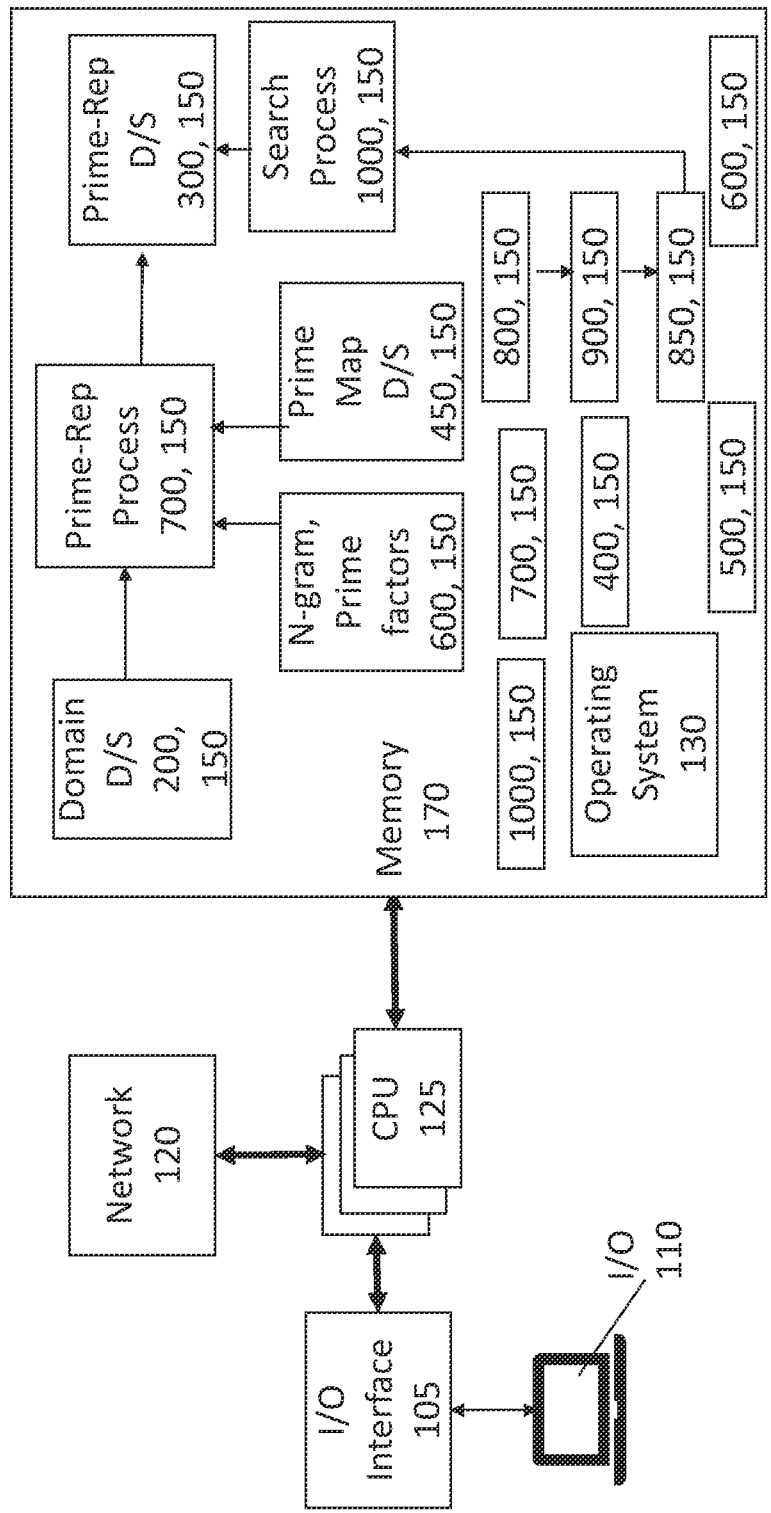
FIG. 1 is a block diagram showing components of a string searching computer architecture.

It is to be understood that embodiments of the present invention are not limited to the illustrative methods, apparatus, structures, systems and devices disclosed herein but instead are more broadly applicable to other alternative and broader architectures, methods, apparatus, structures, systems and devices become evident to those skilled in the art given this disclosure.

In addition, it is to be understood that the various architectures, structures, and/or regions shown in the accompanying drawings are not drawn to scale, and that one or more architectures, structures, and/or components of a type commonly used may not be explicitly shown in a given drawing. This does not imply that the architectures, structures, and/or components not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The data structures and processes disclosed can reside on a volatile memory in one or more computers and/or reside in semiconductor memory chips, like a dedicated Read Only Memory (ROM). Different data structures and/or processes can reside on separate hardware chips, external hard drives, network server memories, and/or other memories, and/or can be all or partly distributed over one or more networks or one or more network devices by known methods.

The presentation of the data structures in this disclosure in non-limiting. All or part of one data structure may become part of another data structure and/or be associated with other data structures by known database techniques like relational databases. Information represented in these data structures can be distributed across multiple memories and/or levels of memory, across multiple devices, and/or across multiple networks.

The processes disclosed are non-limiting as well and are presented to illustrate the structure and function of components of the architecture. Steps of processes may be performed in different sequences or order. Steps of one process may be performed by other processes as long as the function of the invention is maintained.

Devices, structures, and methods disclosed in accordance with embodiments of the present invention can be employed in applications, hardware, and/or electronic systems. Suitable hardware and systems for implementing embodiments of the invention may include, but are not limited to, general purpose computers, communication networks, electronic commerce systems, portable communications devices (e.g., cell and smart phones), solid-state media storage devices, expert and artificial intelligence systems, functional circuitry, neural networks, cloud computing, language translation/analysis, robotics, network searching, client-server systems, etc. Systems and hardware incorporating the data structures and processes disclosed herein are contemplated embodiments of the invention.

Embodiments of the present invention enable a domain representation of large strings, large databases of large strings, and/or domain target queries. These domain representations are transformed into in a unique format and structure to enable a very efficient, fast, and accurate search of databases/repositories of very large records, i.e., with billions or multiple billions of long strings (LS) to be searched determining whether a target string, e.g., one or more instantiations of a short string (SS), resides within one or more of the LS in the database(s)/repository(ies).

The novel architectures, data structures, and processes disclosed are part of a new computer architecture that is enabled to perform these fast, efficient, and accurate string searches. The invention also provides solutions to the problems of character repetition, CR; large numbers/sizes of database(s)/strings, LN; and resource use, RU, discussed above. Alternative embodiments of the invention include multiple processor architectures to enable even faster searching.

Referring now to FIG. 1, a block diagram illustration of one embodiment of the present invention, a string searching computer architecture 100.

The architecture 100 has one or more central processing units (CPUs) 125 and/or cores 125 that can include co-processors 125. An operating system 130 can operate one or more of the CPUs 125 to perform operations on instructions serially and/or in parallel.

The CPUs 125 can be connected to one or more input/output (I/O) devices 110 through known 110 drivers/interfaces 105. Connection of networks 120 is enabled through known network interfaces (not shown).

Non-limiting examples of I/O devices 105 include: keyboards, mice, pointing devices, graphical user interfaces (GUIs); voice recognition systems; digital assistants; cell phones; mobile devices or remote devices, e.g., on vehicles (including automobiles, trucks, trains, boats, etc.,); and remote sensing devices (e.g., image recognition devices), etc. These I/O devices 110 also can be connected to/through the network 120. Other I/O devices 110 currently available or available in the future are envisioned.

These networks 120 and I/O devices 110 are well known and are presented as non-limited illustrations only.

Embodiments of the architecture 100 of the invention reside in memory 170. Non-limiting examples of memory 170 include a dedicated memory, e.g., random access memory (RAM, like a hardware chip), read-only memory (ROM), main memory or levels of main memory within the computer, and/or other memory structures/components distributed over one or more of the networks 120 or I/O devices 110 by known technologies, e.g., memories on one or more network 120 servers. Memories 170 can also include hardware components connected internally and/or externally to the system 100.

For example, architecture 100 components, typically 150, can be embodied in RAM or ROM or solid-state drives connected within internal computer circuitry or as external memory like external hard drives or external solid-state drives (not shown) connected to the system 100 through external connections. These memories 170 can be stand-alone (sold separately) memories that contain some or all the architecture 100 components 150. For example, a ROM chip 170 can contain an entire NL dictionary or the entire works of Shakespeare represented in a prime representation data structure 300, i.e., a NL compilation as a prime representation.

Embodiments of the system architecture components, typically 150, can include: a domain representation data structure 200, a prime representation data structure 300, a selected prime number data structure 400, a prime mapping table data structure 450, a prime mapping table data structure creation process 500, an n-gram creation process 600, a mapping process 700, one or more domain target query data structures 800, one or more prime factor target query data structures 850, a target process 900, and a search process 1000.

Descriptions of the components 150 of the system architecture 100 and how these components 150 cooperate are presented below.

Figure 2:
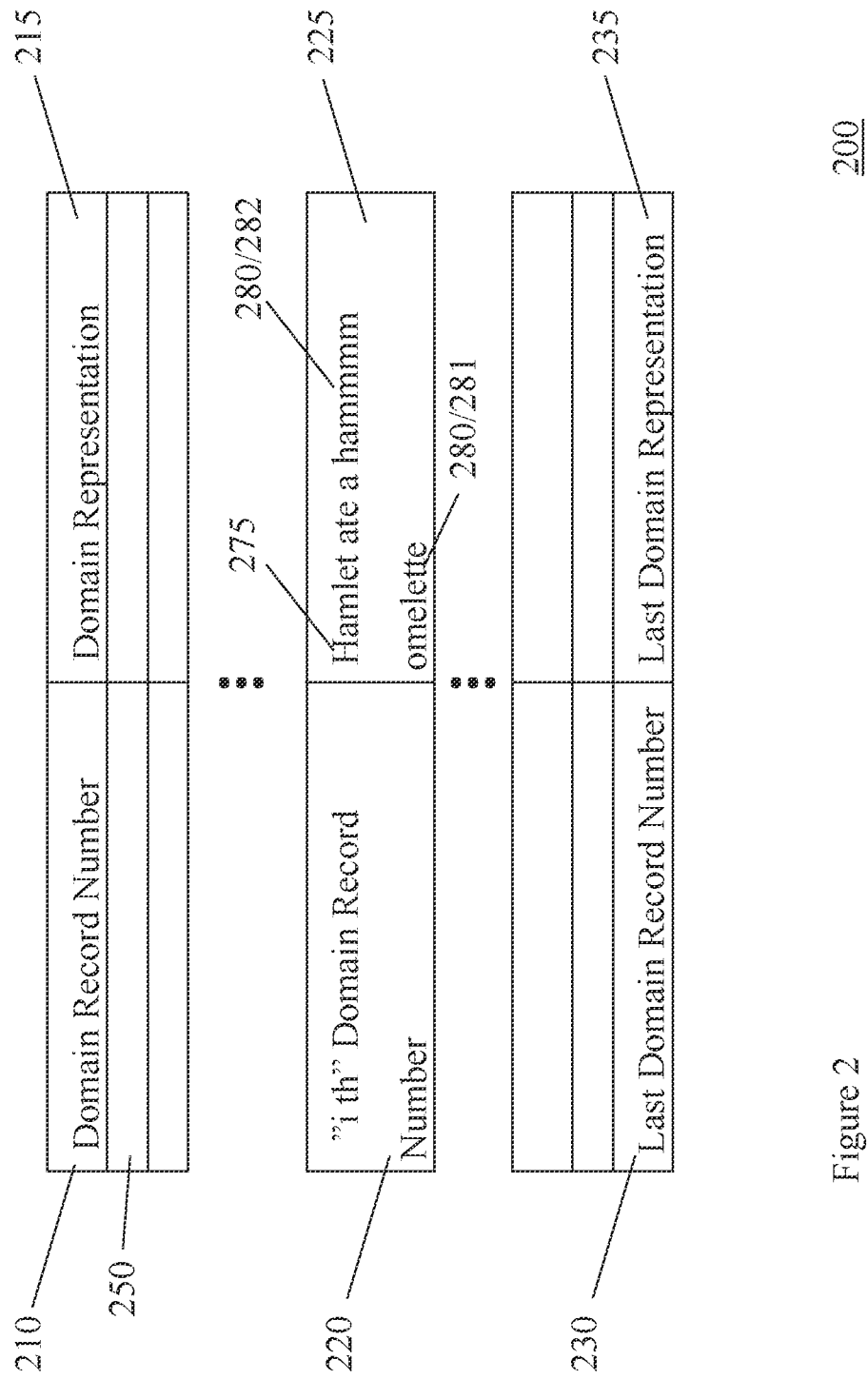
FIG. 2 is a block diagram of a domain representation data structure that includes a plurality of domain data records, one or more of the domain data records having an optional domain record number and a domain representation that is a string made of a plurality of domain characters.

FIG. 2 is a block diagram of domain representation data structure 200 that includes a plurality of domain data records, one or more of the domain data records, typically 250, having a domain record number 210 (optional) and a domain representation 215 that is a string made of a plurality of domain characters 275. An example domain representation 215 in a natural language (NL) domain might be a phase, sentence, and/or paragraph of a NL document.

The domain record number 210 is optional in some embodiments. One purpose of the domain record number 210 is to facilitate an association of the domain representation 215 with other system components 150, like an associated prime representation (see 315/317 description in FIG. 3 below). There are many techniques that can establish these associations, for example the use of keys in relational databases. Any technology that can create these associations/references between records and/or values of fields in records is envisioned.

Typically, the domain representation 215 is made of a series of domain characters 275. For example, in the domain representation data structure 200, the "i th" domain record (number) 220 or association corresponds to a fanciful domain representation 225 where the domain is a natural language (NL), specifically, English. As a non-limiting example, the domain representation 215/225 is the domain natural language of English phase 225, "Hamlet ate a hammmmm omelette." (Note that the word "hammmmm" is intentionally misspelled to later illustrate a point about how the problem of character repetition, CR, is addressed.)

To continue with this non-limiting example, the English NL phrase 225 is made of a domain (English NL) string of English NL characters, typically 275, which, as an example, includes ordered, contiguous letters 275 in the English language, spaces, and English language punctuation. Examples of these domain characters 275 include the English NL letters: "H", "a", "m", etc.

Note that these characters do not have to be characters in the domain per se, like the English NL letters above. Alternatively, these characters 275 can be tokens or representations of the domain character, including numeric tokens. For example, the English NL letter "H" can be substituted/represented by a numeric token like an "American Standard Code for Information Interchange" (ASCII) character or other numeric or non-numeric token 275.

Further, these characters 275 and/or the tokens 275 representing the characters 275 are determined by the domain that the architecture 100 is enabling. For example, if the architecture 100 is used in the domain of speech translation, the characters 275 making up the domain representation could be phonemes 275 and/or numeric (or non-numeric) tokens 275 representing phonemes that make up a domain (spoken natural language) representation of phoneme characters 275. Other domain character types 275 are envisioned.

Note that some of these domain characters 275 are repeated contiguously 280 one or more times. For example, refer to the example repeated contiguous substrings, typically 280, in the domain representation 215/225 as follows: "tt" 280/281 and "mmmm" 280/282.

The last domain record 250 of the domain representation data structure 200 in the presented embodiment includes the last domain record number 230 (or other mechanism for association of data/records/values) and the last domain representation 235 in the domain representation data structure 200.

Note that the length of these domain representation data structures 200 can be huge, e.g., these data structures 200 can have a billion domain records 250, or more. Further, the string length of the domain representation 215/225 can also be huge. As mentioned, an example single domain representation 215 could be as large as the combined works of William Shakespeare, or a large corporate or government database, or the textual content of a large web server.

Considering, as an example, the larger number of domain characters 275 that can exist in a long string (LS) version of a domain representation 215/225 and how many of these LS domain representations 215/225 exist in multiple billions of records 250 in multiple domain representation data structures 200, an appreciation is gained for the present invention that enables the fast and accurate location of instantiations of short strings (SS) in these enormous numbers of domain representations 215.

Figure 3:
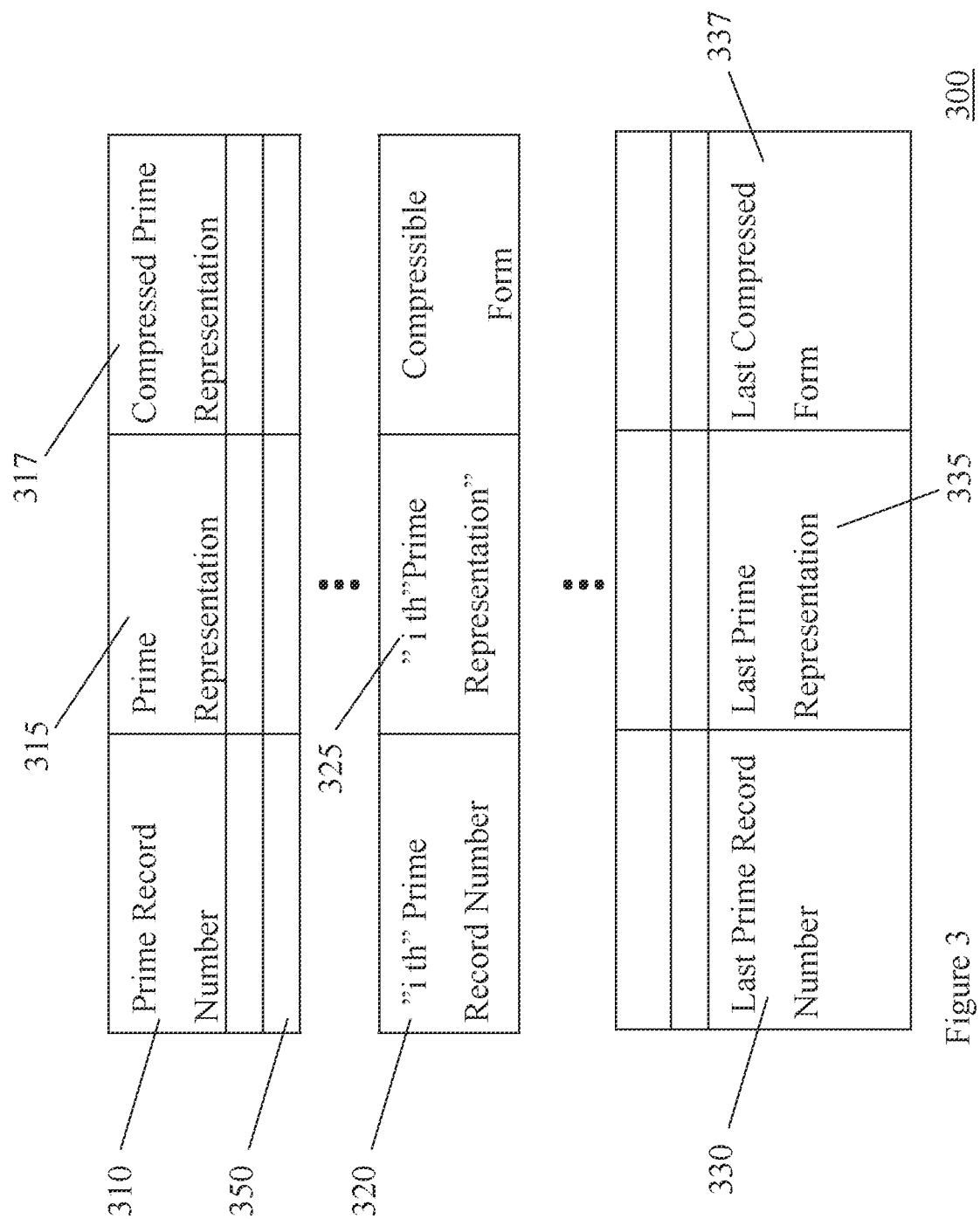
FIG. 3 is a block diagram of a prime representation data structure with a plurality of prime representation data records where each prime representation data record has a prime representation and an optional prime record number and/or a compressed prime representation form.
Figure 4:
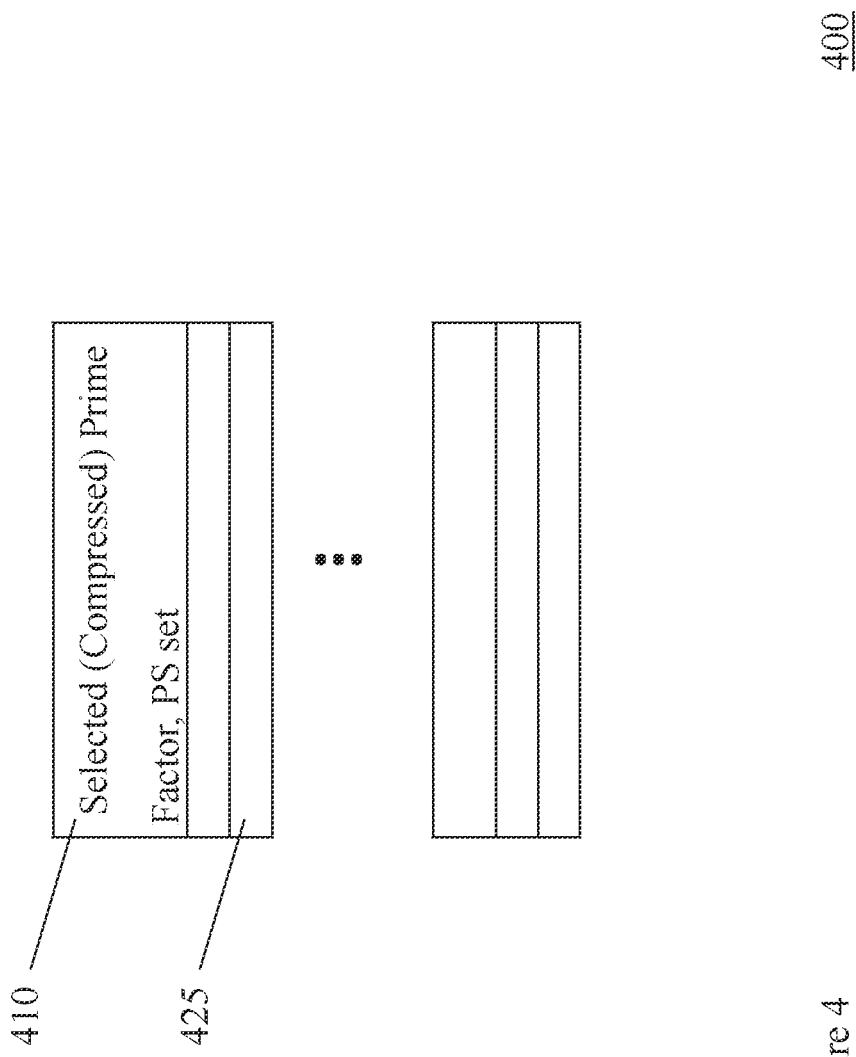
FIG. 4 is a block diagram of a selected prime number data structure containing a listing of selected prime numbers (factors), e.g., in a compressible form.
Figure 4A:
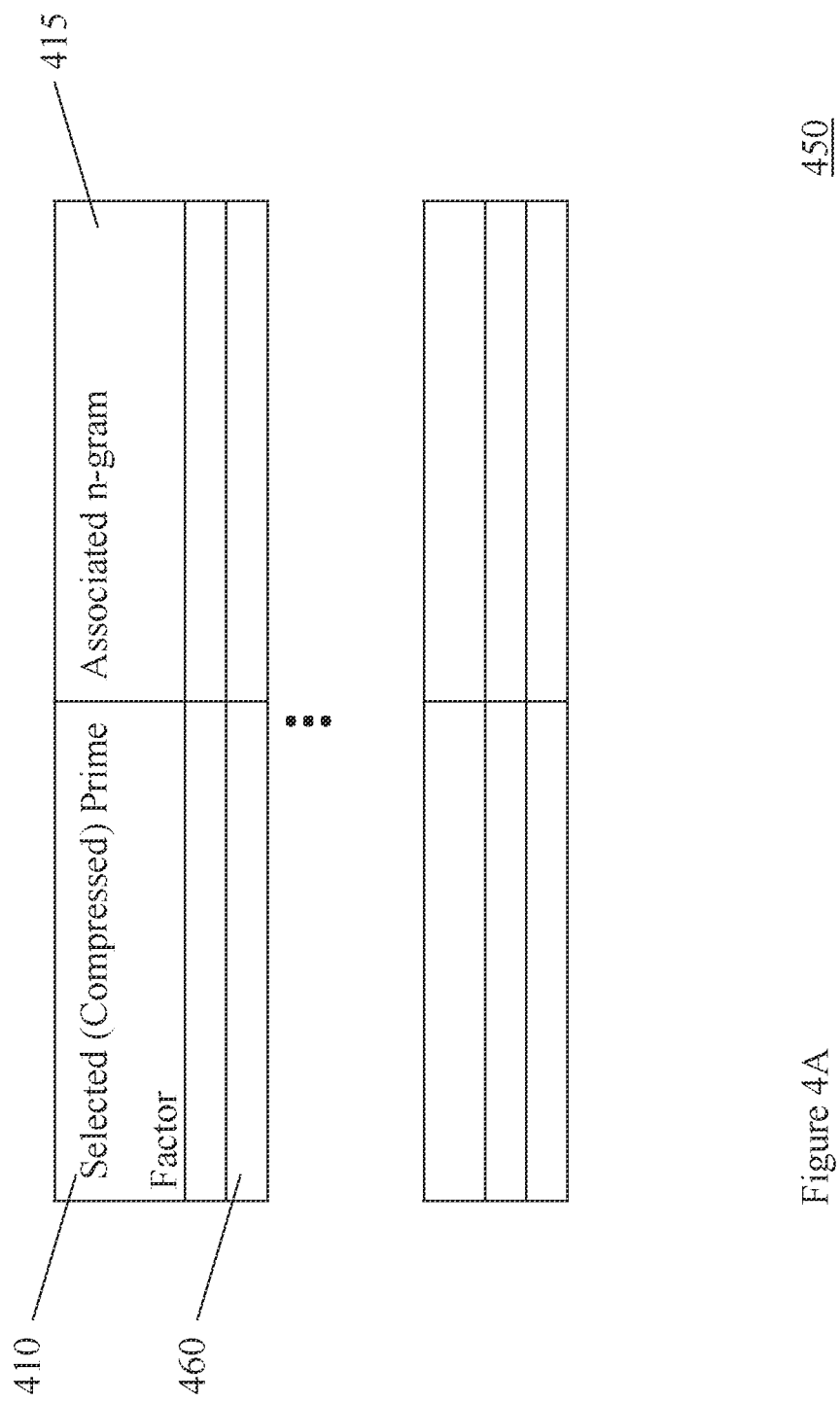
FIG. 4A is a block diagram of a prime map table with a plurality of selected prime numbers (factors), e.g., in a compressible form, where one or more of the selected prime numbers is each uniquely associated with a (domain) n-gram (or domain sub string) of a domain representation.

Refer to FIGS. 3 and 4A.

FIG. 3 is a block diagram of an embodiment of a prime representation data structure 300 with a plurality of prime representation data records, typically 350, where each prime representation data record 350 has a prime representation 315, and/or an optional compressed prime representation form 317.

Again, the prime record number 310 is used to uniquely associate each of the prime representations 315 with a domain representation 215. For example, the "i th" prime record number 320 is used to identify and/or associate the "i th" prime representation 325 (or compressed prime representation 317) with the associated ("i th") domain representation 215/220/275. However, as before, the use of the prime record number 310 is optional if other known methods of association are used.

In preferred embodiments, the prime representation 315/325 or compressed prime representation 317 is the product of a plurality of selected prime factors 410 (described below) that each uniquely represent an n-gram 415 (described below) in the domain representation 215/275.

In some preferred embodiments, the unique prime factors 410 are in the compressed form 317 and their product creates the prime representation 315/325/335 that is in the compressed form 317. Multiple compressed forms 317 are envisioned.

In addition, in some preferred embodiments, a compressed form 317 for the prime factors 410 and the resultant prime representation 315/325/335 is formed as a product of the selected prime factors 410 where each of the selected prime factors conforms to selection restrictions that determine the characteristics of the selected prime factor 410. The selected prime factors make up a set of prime factors or Primes Selected (PS) set.

In some embodiments, the selection restrictions (form of the selected prime factor 410) are: 1. the Euler totient of the selected prime factor 410 that can be defined in an exponential form, 2. the base of the exponential form is chosen from a set (First Prime Set or FP set) of "fp" number of small or first prime numbers, and 3. the exponent of the exponential form is variable and unique. This form of compressed prime factor(s) 410 enables the compressed prime representation 317 to be rapidly and accurately searched.

For example, the prime representation 315 is made of a product of the selected prime factors 410 (describe below). The prime factors 410, e.g., the compressed form of the prime factors 410, are multiplied together to create a prime representation 315.

If a target query, i.e., a short string -SS, (see description of FIG. 8B below): i. is represented in the compressed form (as a product of one or more of the prime factors 410) and ii. divides evenly into the prime representation 315 of one or more LS (i.e., the division has a modulo of zero), then the respective SS occurs within those LS. Efficient methods are included in the structure of the architecture to perform this division/comparison operations. To function correctly, these methods are a practical application of the information and structure of information in the data structures of the architecture 100.

Again, in preferred embodiments, the prime representation 315 (compressed prime representation 317) is a product of a plurality of compressed prime factors 410, where each compressed prime factor 410 is associated with a n-gram, i.e., a string of ordered characters 275 (n characters in length) contained in and as a subset of the domain representation 215 of one or more of the LS.

Continuing with a non-limiting example in the English NL domain, here each English NL domain natural language character 275, (e.g., "H", "a", "m", etc.), as an n-gram, is mapped to a prime factor 410, e.g., p(H), p(a), p(m), etc. In this example, the n-gram has an n value of "1", i.e., the n-gram is one character 275 in length. In some embodiments, the prime factors 410 are in compressed form. Then each prime representation 315 of the domain representation 215 of one or more long strings, LS, is created by multiplying together the each of the selected prime factors 410 associated with the each of the respective domain characters 275 of the domain representation 215.

Here the notation "p(H)" means prime factor 410 representation of the domain representation (of character) of "H".

In some embodiments, the n-grains are longer than 1 domain character 275, as described below. Longer n-grams remove errors when the same character is repeated contiguously in the domain representation 215/225, e.g., the repeated contiguous string "mmmm" 280/282.

For example, the English NL domain representation 215 of the word "Ham" is mapped to the prime representation 315 p(H)*p(a)*p(m), where p(H) is a prime factor 410 associated with the domain representation 215 for the domain character 275, "H", etc. As described below, in some embodiments, the prime factor 410, e.g., p(H) is compressed and by extension, the prime representation 315 p(H)*p(a)*p(m) is also in compressed form, a compressed prime representation 317.

Note that the n-gram used is not restricted to a single domain character/token 275. For example, a prime factor p(Ham) 410 is the prime factor 410 associated with the domain representation 215 for the n-gram of domain characters/tokens 275, "Ham", etc.

Figure 8A:
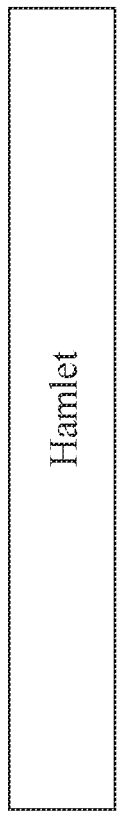
FIG. 8A is a block diagram of a domain target query data structure.
Figure 8B:
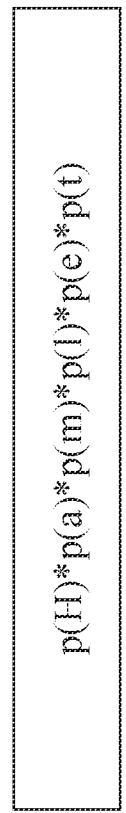
FIG. 8B is a block diagram of a prime factor target query data structure.
Figure 9:
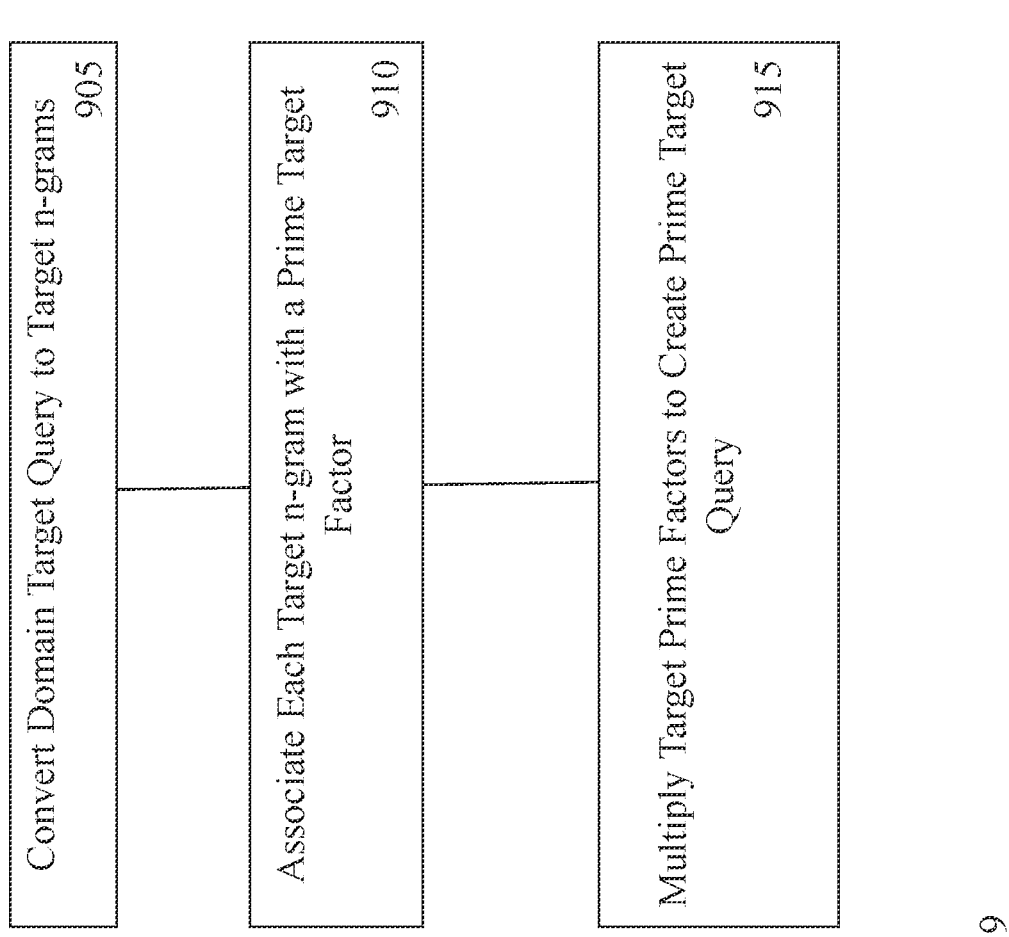
FIG. 9 is a flow chart of a target process that transforms a domain target query data structure into a prime factor query data structure.

As described in more detail in FIGS. 8A, 8B, and 9, a domain target query data structure 800, e.g., of a short string, SS, can be transformed into a prime factor target query data structure 850 by similar methods as just described. In preferred embodiments, the same prime factor(s) 410 (e.g., p(Hamlet)) is used to represent the same domain representation, e.g., "Hamlet", in both the target query 800 and the (compressed 317) prime representation 315. Using the components 150 of the architecture 100 in this manner, the architecture 100 can determine if the SS is contained in the prime representation 315 (of the domain representation 215 of the long domain string, LS). In some embodiments, the domain representation of the SS (e.g., "Hamlet") is contained in the long domain string, LS, if and only if the prime factor target query data structure 850 divides evenly into the prime representation 315, e.g., the division has a modulo of "zero".

Refer to FIGS. 4 and 4A.

FIG. 4 is a block diagram of a selected prime factor data structure 400 containing a listing of selected prime factors (e.g., the PS set) 410, e.g., in a compressible form.

FIG. 4A is a block diagram of a prime factor mapping table 450 with a plurality of selected prime factors 410, (e.g., in a compressible form), where one or more of the selected prime factors 410 is each uniquely associated with a (domain) n-gram 415 (or domain sub string) of a domain representation 215. See FIG. 5 for the description of a prime mapping table creation process 500 that creates this, or a similar, prime factor mapping table 450. See FIG. 6 for a description of an n-gram creation process 600 for creating n-grams 415.

The selected prime factor data structure 400 contains a listing of selected prime number factors 410, preferably in a compressible form. The number, sp, of selected prime factors 410 listed in the selected-number data structure 400, or number of selected prime factors 410 in the PS set, can vary. In systems with a larger number of n-grams 415, more selected prime factors 410 are needed in the PS set. In systems with few numbers of n-grams 415, fewer selected prime factors 410 are needed. The selected prime data structure 400 can be created, e.g., with a process 500 like that described below in the description of FIG. 5. The selected prime data structure 400 can reside in one or more memories located internal to the system architecture 100, external to the system architecture 100, and/or distributed across memories of devices and/or components over one or more networks.

In some embodiments, the selected prime factors 410 are selected by meeting one or more constraints or selection restrictions. Typically, these constraints select prime number factors 410 that enable faster comparisons of one or more SSs and LSs while using fewer system resources.

In preferred embodiments, the selected prime factors 410 are a subset of prime numbers selected from a set of prime numbers. Typically, this set of prime numbers, PS set, is chosen as the set starting at a low value prime number, e.g., 2, and includes each next increasing prime number until an adequate PS set size is reached.

In a preferred embodiment, the constraints or selection restrictions for selecting the selected prime factors 410 in the PS set are: 1. The prime factor 410 is a Euler's totient that can be expressed in an exponential form where the base of the exponent form is typically a low value prime number and 2. exponents of the base in the exponential form are variables which are unique values that cause the respective prime factor 410 to be unique. Using these criteria, a process, e.g., like the process 500 shown in FIG. 5 goes through a set of prime numbers and selects those prime numbers, as selected prime factors 410, that meet these criteria. Selected prime factors 410 in this form are considered in the compressed form.

In these embodiments, only those selected prime factors 410 that meet the selection criteria are chosen to be associated with an n-gram 415, for example, by using a data structure 450 like that shown in FIG. 4A. Other association methods are envisioned.

Euler's totient or Euler's totient function or Euler's indicator, ϕ(p), is the value representing the number of integers less than p that are coprime with p in the decomposition of an integer. "Coprimes" are numbers that share no common divisor (except 1) with another coprime. For instance, the numbers 4 and 9 share the number 1 as the only common divisor and therefore are coprimes. As another example, two numbers are coprimes if their greatest common divisor (GCD) is equal to 1.

The prime mapping table 450 establishes an association between one of one or more n-grams 410 in a plurality of n-grams, i.e., an associated n-gram 415, with a unique selected prime factor 410.

Figure 6:
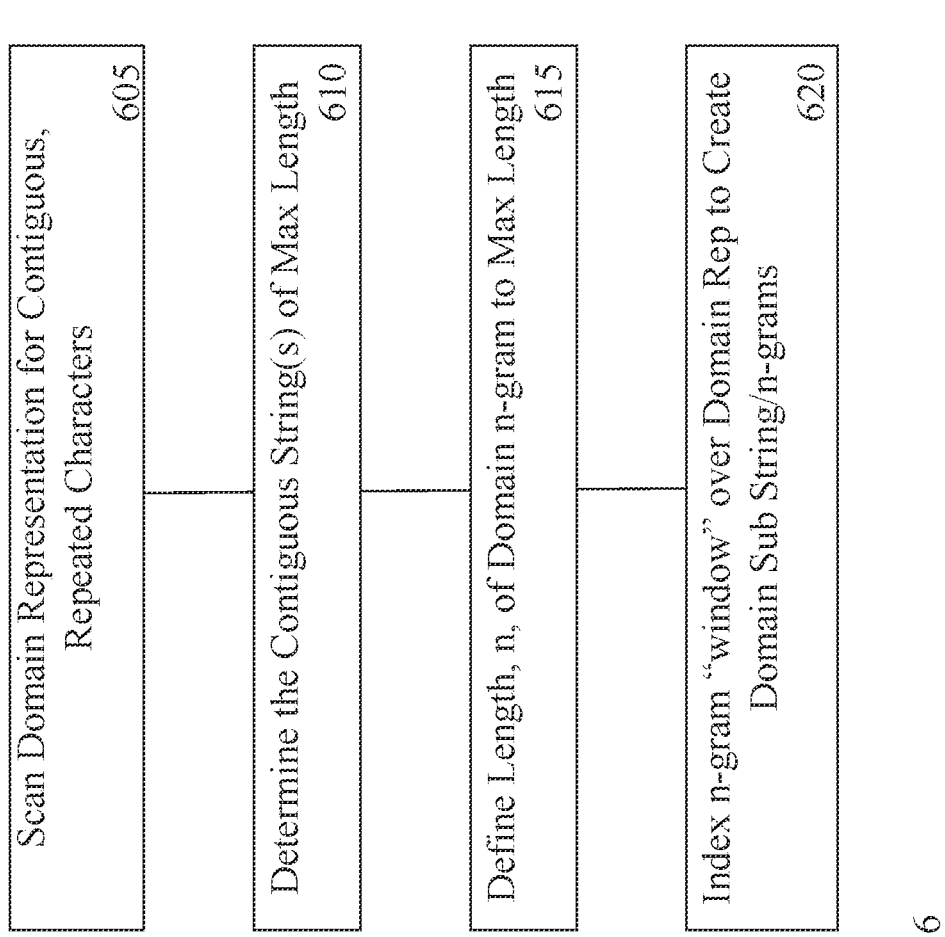
FIG. 6 is an n-gram creation process.

An n-gram 410 is a substring of n number of ordered, contiguous domain characters 275 in a given domain representation 215/225/235 as further described in FIG. 6.

The prime mapping table 450 has a plurality of prime map table 450 records 460. Each prime mapping table record 460 has a unique selected prime factor 410. The prime map table 450 establishes/defines a unique association between one of the selected prime factors 410 and a n-gram 415. The association can be established by including a selected prime factor 410 in the same prime map table record 460 as the associated n-gram 415 or by other known methods used in databases.

For example, the English NL domain Representation of "Hamlet" might have an n-gram of "Ham" that is transformed into three selected prime factors 410: p(H), p(a), and p(m). In some embodiments, the associated prime factors 410 are multiplied together to form the prime representation 315, p(H)*p(a)*p(m), of the domain n-gram "Ham". In other embodiments, e.g., where the number of characters, n, in the n-gram is 3, the n-gram "Ham" may be associated with a single prime factor 410, e.g., p(Ham).

In some embodiments, the prime factors 410 are used in a compressed form. The compressed form of prime factors 410 enables construction of prime representations 315 that are searchable in an accurate and rapid manner. In some embodiments, only those prime factors 410 that are in and/or can be put in a compressible form and are selected in a prime factor selection table 400 are associated with n-grams, e.g., by prime mapping data structure 450. It is envisioned that one or more of the functions of the prime factor selection table 400 and the prime mapping data structure 450 can be combined and/or interchanged in different data structure formats.

In some embodiments, the compressed form of the prime factors 410, and as a result, the compressed form 317 of the prime representation 315 is an exponential form. In one exponential form of a given prime factor 410, each of the prime factors 410 is represented as a common given base with a unique exponent. Since the base(s) is known (e.g., an element of the FP set) and given, each prime factor 410 is uniquely identified by a unique exponent. Further, by creating the prime representation 315 as a product of these prime factors 410, extremely long strings of prime representations 315 (and therefore their associated domain representations 215) can be created and tracked by using these exponents matched with each of the specific, known bases. In addition, operations like division on these long strings can be performed quickly and easily by tracking and adjusting exponents of the exponential form of a given prime factor(s) 410. As such, the large string, LN, problem and the resource use, RU, problem are greatly reduced or eliminated by this novel architecture 100.

For example, in some preferred embodiments, in the set PS of prime factors 410, the prime factors 410 are Euler Totients (or products of totients) that can be expressed in exponential forms, each with a base and exponent, with the exponential form: $Base_i^{exponenti}$, where "$Base_i$" is the base and "exponenti" is an exponent. In a preferred embodiment, $Base_i$ is a fixed small prime number, e.g., selected from the First Prime Set or FP set. In some embodiments, the set includes the first 20 primes or the first primes with a value, e.g., maximum prime value, less than 50, for instance:

FP={2, 3, 5, 7, 11, 23, 17, 23, . . . , 47} would be an example set of the only first prime numbers (values all under the maximum prime value of 50, the first 20 primes, etc.) from which fixed values of various $Base_i$ are chosen. In an embodiment, these primes that are selected as bases, are not used as prime factors.

It is known that the Euler Totient(p), i.e., the Euler Totient of a prime number p, is=p−1. Therefore, any base to the exponent of the form k*p+r has the p modulo equal to base to the exponent r. For example, the forms are periodic with period "p". So that for each multiple of "p" instances, there is the same set of "r" values. Accordingly, a table (see below) can be made for each base and prime (p) pair recording all values of "r" in a first period (i.e., from 0 to p−1). This gives the "p" number of modulos, i.e., "r's", of the selected prime factors 140. This is a result of "Fermat's little theorem."

In some embodiments, the prime factors 410 are selected by scanning through a set of prime numbers, taking the Euler Totient of each prime number, and selecting those prime numbers that can be represented as exponential forms with bases values selected only from the set of first primes, FP. Accordingly, the bases, $Base_i$, of the exponential forms are known and limited to those in the set of first prime numbers FP.

It is found that a bit more than 18,000 selected prime factors 410 out of a set of the first 1,000,000 general primes meet the selection criteria/restrictions above. Here are some non-limiting examples of selected prime factors 410 (see also steps 510 and 515 of process 500 below):

I. a selected prime factor 410 is p=5 because the Euler totient of 5, Euler totient (5)=p−1=5−1=4=$2^2$, where in the exponential form $2^2$, the base is "2" selected from set FP and the exponent is 2.

II. a selected prime factor is p=1787, because the Euler totient (1787)=1787−1=1786=2*19*47, where each of the bases (2, 19, 47) is selected from the set FP and each base has an exponent of 1.

III. III. a selected prime factor is p=1801, because the Euler totient of 1801 is 1801−1=1800=$2^3*3^2*5^2$, where each of the bases (2, 3, 5) is selected from the set FP and each base has an exponential form with an exponent 3, 2, 2, respectively.

As stated above, the prime representation 315/325/335 can take the form of a product of the selected prime factors 410 each associated with an n-gram of the domain representation 215/225/235/315, to be expressed in a compressed prime representation 317 or exponential form, as an example:

$A^{\alpha}*B^{\beta}* \ldots *W^{\omega}$, where

A, B, and W are bases, preferably selected from the set FP and α, β, and ω are the respective exponents of the bases.

Figure 5:
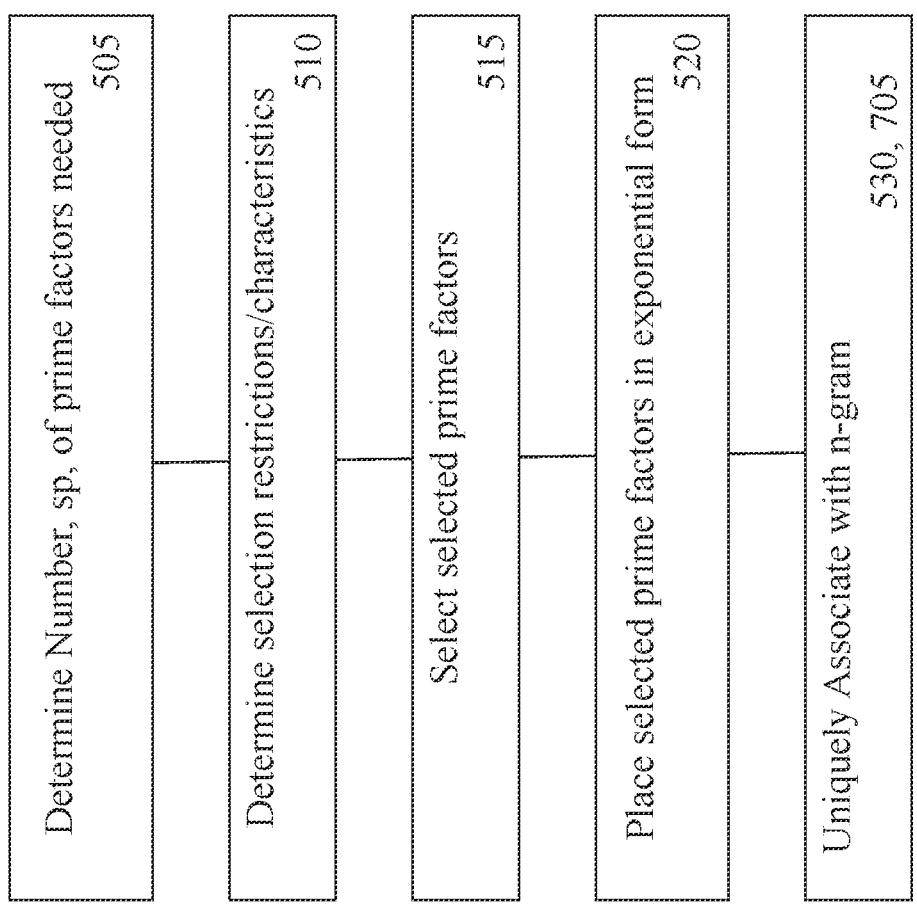
FIG. 5 is a flow chart of a prime map data structure and prime mapping table creation process.

FIG. 5 is a flow chart of a prime mapping data structure 450 creation process 500.

In step 505 of the prime mapping data structure creation process 500 chooses a sample space of prime numbers. The size, sp, of this sample space is determined by the number of n-grams the system will need to process. If the sample space does not yield enough selected prime factors 410, the sample space can be increased and the process 500 repeated. Generally, the sample space used starts with prime number of low value and continues selecting the next prime of larger value until enough prime numbers are selected.

Step 510 of the process 500 determines the selection restrictions 510 which will define the characteristics of the selected prime factors 410. For example, as stated above, in some embodiments, the selected prime factors 410 are Euler's totients of the prime numbers that can be written in exponential form with the base of the exponential form being a small value prime number, e.g., as in set FP, a first number of primes (like the first 20 primes) or primes below a limit value like 50.

It is known that the Euler's totient of a prime number, P, is P−1. Therefore, as an example, the Euler's totient of the prime number 5 is 5−1=4. This Euler's totient can be written in exponential form with the base of the exponential form being a small value prime number, 2. Accordingly, the Euler's totient of the prime number 5 can be expressed in exponential form 510 as $2^2$, therefore, the prime number 5 can be selected 515 as a selected prime factor 410.

In some embodiments, the selection restrictions 510 require that the base values of all selected prime factors 410 be limited to one of the set of the first 15 prime numbers. For example, the prime factors are limited to a subset of the set of the first 15 prime numbers. In other embodiments, the prime factors 410 are limited to a prime number below a given limit value, like 50, and/or are a subset of the prime numbers with a value less the given limit value. These types of selection restriction are imposed because as the number of bases in the selected prime factors 410 increases, data structures in the architecture 100 become larger and/or computation resources of the architecture 100 increase.

Therefore, there is a tradeoff between database size and computational resources and the number of n-grams required in a domain. As the number of required n-grams increases, e.g., because a domain might have a lot of repeating characters and/or long repeating character strings, the number of selected prime factors 410 will also increase.

It is noted that prime mapping database creation process 500 can select from the first 1,000,000 prime numbers about 18,000 prime factors 410 with a Euler's totient in exponential form where every exponential form can be represented using only bases from the set of the first 15 prime numbers, e.g., the FP set.

In step 515 of the process 500, the selected prime factors 410 meeting the selection restrictions 510 are selected from the set of prime numbers.

In step 520, in a preferred embodiment, the Euler's totient of each of selected prime factors 410 is put into an exponential form with a product of one or more bases, where each base is raised to an exponent. This is referred to as the compressed form of the selected prime factor 410.

In step 530, one of the selected prime factors 410 is uniquely associated with an n-gram. The association can be made using data structure 450 like the one shown in FIG. 4A. Other methods of association are envisioned.

The process 500 steps 505/510/515/520/530 can be repeated until enough selected prime factors 410 are identified and uniquely associated with an n-gram. For instance, the process 500 repeats until all n-grams are associated with a unique selected prime factor.

In alternative embodiments, process 500 is performed off-line to create the prime mapping data structure 450 that is stored in one or more memories that can be used in a later operation of the architecture 100. These prime mapping data structures 450 can be provided in stand-only memories, e.g., embodied on ROM or RAM, and/or can be stored on web servers/devices accessible by the architecture 100 through one or more of the networks.

FIG. 6 is a flow chart of an n-gram creation process 600.

Step 605 of the n-gram creation process 600 scans one or more of the domain representations 215/225/235 to find repeated, contiguous substrings of domain characters 275, For example, step 605 might find the repeated, contiguous substrings 280: "tt" 281/780 and "mmmm" 282/280.

Step 610 of the n-gram creation process 600 determines the length of the longest repeated, contiguous substring, i.e., the maximum length. Many ways of performing this step 610 are envisioned.

For example, the length (stored length) of the first encountered repeated, contiguous substring 280 is stored in the scan of the domain representation(s) 215/225/235. The length of each subsequent repeated, contiguous substring, typically 280, is determined. If a subsequent substring 280 has a length longer than the stored length, the longer length replaces the previous stored length. The process continues until the all the domain representations) 215/225/235 are completely scanned.

In step 615, the n-gram length, n, is defined as the maximum length of a repeated, contiguous substring/character 280. The maximum length stored is the stored length after the domain representation(s) 215/225/235 are completely scanned. This n will be the maximum length of any repeated, continuous substring 280 of domain characters/tokens 275 in the domain representation(s) 215/225/235.

In step 620, a window, n number of characters 275 wide, is formed. The window begins at the beginning position of the domain representation(s) 215/225/235. The n characters/tokens 275 forming the substring of characters/tokens 275 within the window is a first n-gram of the domain representation(s) 215/225/235. Th n-grams are ordered since they contain n character/tokens 275 in the same order as appears in the domain representation(s) 215/225/235.

The window is then indexed to obtain a next n-gram. The window can index any number of characters/tokens 275 up to the number of characters/tokens 275 in the window. However, one preferred embodiment indexes the window one character/token 275 at a time. This process repeats until the window has indexed over the entire domain representation(s) 215/225/235, defining/creating an n-gram at each index location and ultimately a set of n-gram substrings 620 for the domain representation(s) 215/225/235.

Other methods for creating the set of n-gram substrings 620 are envisioned.

Using a window with a width at least as wide as the maximum length greatly reduces or eliminates the problem of having erroneous representations of a repeated, ordered, continuous substring 280 of domain characters/tokens 275. Thus, the character repetition problem (CR) is reduced or eliminated.

As an example, in an English NL domain, an n length between 3 and 5 gives a high probability that there will be no repeating n-grams 415 within a subset of a couple of hundred contiguous words. Therefore, with an n-gram length of 5 in an English NL domain, there is a near certainty that there will be no repeating n-grams 415 within a subset of a couple of hundred contiguous words. In some embodiments, the n-gram 415 length, n, is determined for a near certainty and then increased to n+1.

Figure 7:
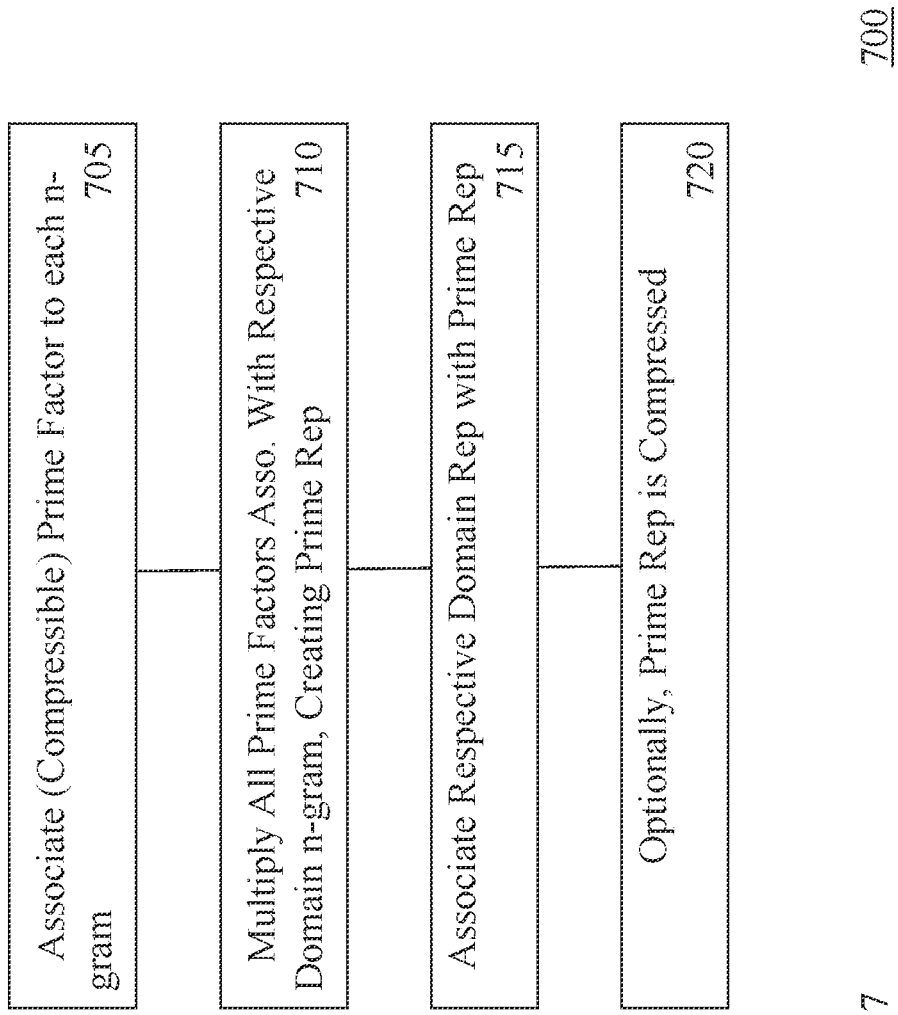
FIG. 7 is a flow chart of a mapping process that creates the prime representation data structure of FIG. 3 by transforming and mapping the n-grams of domain representations into a respective prime representation each containing one or more prime factors, where each prime factor is uniquely associated with a respective n-gram of the domain representation of FIG. 2.

FIG. 7 is a flow chart of a mapping process 700 that creates the prime representation data structure 300 of FIG. 3 by transforming and mapping the n-grams 620 of domain representations 215 into respective prime representation 315 by using the selected prime factors 410, where each selected prime factor is uniquely associated with a respective n-gram 415/620 of the domain representation 215.

The mapping process 700 begins with step 705 which associates each of one or more n-grams 415/620 uniquely with a selected prime factor 410 as discussed in the description of FIGS. 4 and 5. In some embodiments, the prime factor 410 is selected from and is in a compressed form, e.g., an exponential form of Euler's totient conforming with selection restrictions 510, as explained above.

Step 710 multiplies all the selected prime factors 410 that each are uniquely associated with a domain n-grams 415 in the domain representation 215. This creates a prime representation 315 associated with the respective domain representation 215. Each occurrence of a specific domain n-gram 415 will result in an occurrence of the uniquely associated selected prime factor 410 in the product making up the prime representation If one or more of the prime factors 410 making up the prime representation 315 is in the compressed form, the prime representation 315 is at least in a partially compressed form. In some embodiments, all the prime factors 410 are in a compressed form. More specifically, in some embodiments, all the prime factors 410 are in an exponential form of Euler's totient and most, preferably all, of the prime factors 410 have a common base of known value that is a low value prime number.

In these compressed forms, e.g., with each prime factor 410 in an exponential form of Euler's totient with a common base of known value of a small prime number, all the selected prime factors 410 (and the associated domain n-grams 415) can be accounted for by knowing the exponent of the respective selected prime factor 410 and the number of occurrences of the respective selected prime factor (identified by the exponent of the compressed form of the selected prime factor). This information can be kept in a table listing the respective exponent for each selected prime factor, the base(s) of the selected prime factor, and optionally the domain n-grain 415 uniquely associated with the respective exponent.

Operations on (like division of) the prime representation 315/compressed prime representation 317 can be performed and/or tracked by changing/tracking the respective exponent for each base (e.g., small prime number) of a given prime factor 410. The architecture 100 can perform these operations rapidly.

In step 715, the prime representation 315/317 (product of the selected prime factors 410) is associated with the domain representation 215 represented through used of the domain record number 210 and prime record number 310 or any other known database technique.

Step 720 optional creates a partially or fully (preferably) compressed prime representation 317 by using one or more compressed selected prime factors 410 prime representation 315/compressed prime representation 317 in multiplication of the selected prime factors 410 in step 710.

In an alternative embodiment, two or more associations are performed. For example, process 700 is repeated where a given associated prime factor is associated with a different n-gram in the first association. These next associations can be tracked by adding more than one associated n-gram field 415 to each record 460. A search is done as described below with the first associations made between the selected prime factors 410 and the associated n-grams 415. Then the search is repeated with the second (and, in some embodiments, additional) associations between the selected prime factors 410 and the associated n-grams 415. In a parallel processing system, these searches can be performed in parallel at the same time although with some doubling of resources. The results of the multiple searches are ANDed together. This alternative process greatly eliminates the possibility of errors due to two different n-grams being mapped to the same selected prime factor 410.

FIG. 8A is a block diagram of a domain target query data structure 800. For example, a user chooses to search the domain target query "Hamlet" 800. The domain target query is made of sequence of domain characters 275 in a query sequence.

FIG. 8B is a block diagram of a prime factor target query data structure 850. The prime target query data structure 850 is a product of selected prime factors 410 each uniquely associated with an n-gram of the domain target query 800. In some embodiments, these selected prime factors 410 are in compressed form, as described above. These n-grams are created by processing the prime factor target query data structure 850 with process 500.

The prime target query representation 850 resides in the prime target query data structure 850 and is the product of the selected prime factors 410 associated with each of the n-grams of the domain target query 800.

As each prime generates a cyclic modulo group, a table of modulus for the chosen bases is kept in memory. That is, for each chosen base and the exponent that makes the number base to the exponent greater than a prime, the modulo is repeated. By recording the table representing the modulo group for each prime, then we know for any exponent what is the modulo.

In some embodiments, a number of, e.g., the first 16, prime numbers are used as bases (see the description of FIG. 11, below) and are not used as selected prime factors 410.

The table of modulos for each base and selected prime factor 140 pair, looks like key: exponent, value: modulo, for the first exponents that are lesser than the selected prime factor 140. For example for base 2 and the selected prime factor 1081, the table will contain 1081 entries—(1,2), (2,4), . . . (10, 57), (11, 114), . . . , (20, 6), . . . (1000, 209), . . . (1080, 115). The meaning is that the 1081 modulo of 2 to the power <first_element_of_pair> is <second_element_of_pair>., like in (100, 209) it means that 2^1000 mod 1081=209.

For example, for 15 bases and approximately 20,000 selected prime factors yields 300,000 tables. Each table has about $10^4$ integers on average.

For instance, a number of prime numbers, typically low value prime numbers, are selected as bases. The bases have values less than the lowest selected prime factor 140, typically low value prime numbers. These prime numbers selected as bases will not be used as selected primes factors 140. In one embodiment, 15 low level prime numbers are selected as bases. For example, the bases could be the prime values "A"=2, "B"=3, "C"=5, "D"=7, "E"=11, "F"=13, "G"=19, "H"=23, "I"=29, "J"=31, "K"=37, =41, "M"=43, "N"=47, and "O"=51, where each of the alphabetic letters is associated with a base.

In some embodiments, a table of modulos (modulo table) is made for each of these bases, A through N for each selected prime factor 140. Each of the modulo tables is used to determine and store the exponent value for a respective base that equals one of the selected prime factors 140 when the base is raise to that exponent value. The modulo (e.g., r values) for each respective selected prime factor 140 for the respective base is also stored in the modulo table.

An example modulo table for a base of 2 ("A") is given below. For each selected prime factor 140, e.g., 1801, an exponent for the base of the table (table base), here the base=2, is determined and the modulo is stored.

| Exponent of Base | Selected Prime Factor | Base ^ Exponent Modulo selected prime factor |
|---|---|---|
| 1 | 1081 | 2 |
| 2 | 1081 | 4 |
| ... | ... | ... |
| 1000 | 1081 | 209 |
| ... | ... | ... |

In a preferred embodiment, perform the modulo operation for each base for each selected prime factor 140 and store the modulo results in the table of modulos.

Compute the modulo for each combination (or read it from memory if stored).

Return the modulo and in concordance with its value the answer of included/not included.

FIG. 9 is a flow chart of a target process 900 that transforms a domain target query data structure into a prime factor query data structure.

In step 905 of the target process 900, the domain representation of the target query 800 is converted to one or more target n-grams 905 as described above. The same value of n used 615 in the process for creating the n-grams in process 600 is used in step 905 to create the target n-grams 905.

Step 910 associates each target n-gram is associated with a prime target factor. If an n-gram created in process 600 is associated with a particular prime factor 410, the same prime factor 410 is used as the target prime factor 910 with the equivalent n-gram.

In step 915 of the process 900, each of the target prime factors 910 associated with a target n-gram 905 in the (domain) target query 800 is multiplied together to create the prime target query 850.

Figure 10:
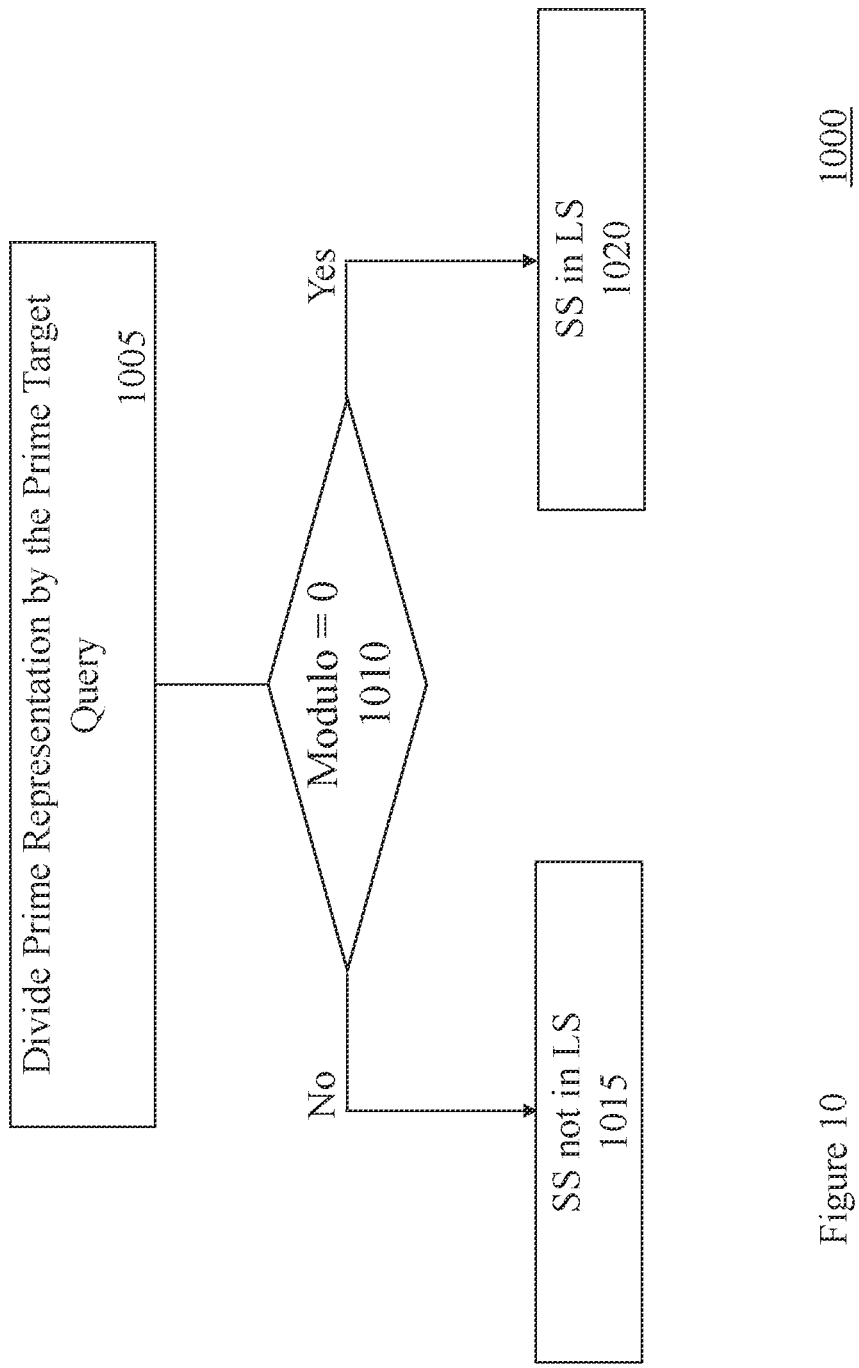
FIG. 10 is a flow chart of a search process.

FIG. 10 is a flow chart of a search process 1000.

Step 1005 of the search process 1000 begins by dividing the prime target query 850 into the prime representation 315/317. If the prime target query 850 divides evenly into the prime representation 315/317, i.e., there is no remainder, the selected prime factors 410 of the prime target query 850 exist in the prime representation 315/317. This means the n-gram 415 associated with the common selected prime factors (both in the prime target query 850 and the prime representation 315/317) are also common between the domain representation 215 and the domain target query 800.

In step 1010, the modulo of the division in step 1005 is tested.

If the modulo equals 0, the prime target query 850 divides evenly into the prime representation 315/317, i.e., there is no remainder. This means that there is an occurrence of the domain target query 800 in the domain representation 215. In other words, the SS is within the LS 1020.

Alternatively, if the modulo does not equal 0, the prime target query 850 does not divide evenly into the prime representation 315/317, i.e., there is a remainder. This means that there is an occurrence of the domain target query 800 is not in the domain representation 215. In other words, the SS is not within the LS 1015.

This division 1005 and modulo operation 1010 can be performed very rapidly and solves both the LN and RU problems discussed above. The prime target query 850 is compared with the prime representation 315/317 to determine whether they both have a selected prime factor with a common base. If the exponent of that common prime factor in the prime representation 315/317 is larger than the exponent of the common prime factor in the prime target query 850, the n-gram associated with the respective common prime factor occurs in both the prime representation 315/317 and the prime target query 850.

In some embodiments, if the modulo is 0, the SS will occur in the LS.

Figure 11:
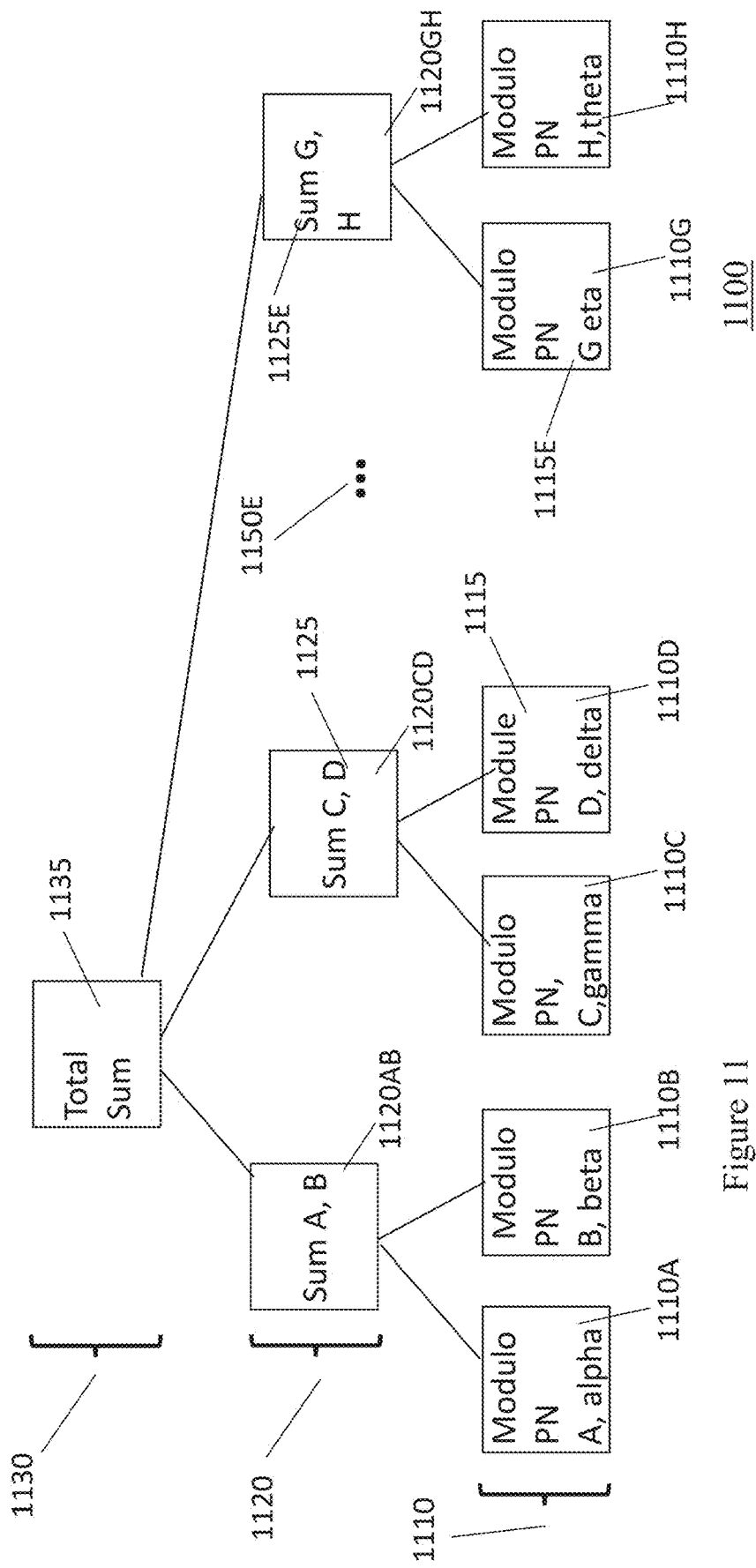
FIG. 11 is an architecture of multiple processors processing a plurality of selected prime numbers, e.g., in a compressible form, that make up a prime representation.

FIG. 11 is a block diagram of an alternative system architecture 1100.

The alternative system architecture 1100 is a hierarchy of sets of processors 1110/1120/1130.

In one embodiment, a set of modulo processors 1110, including processor 1115 and 1115E, each calculate the modulo for a given selected prime factor 140, PN.

In one embodiment, each processor, e.g., processors 1110A-1110H, on the modulo processor 1110 level of the hierarchy 1100 determines the modulo for one or more selected prime factors 140, PN, for a given base value. For example, processor 1110A determines the modulo for one or more selected prime factors 140, PN, for the base of A including base A's exponent alpha, processor 1110B determines the modulo for one or more selected prime factors 140, PN, for the base B including base B's exponent, beta, processor 1110H determines the modulo for one or more selected prime factors 140, PN, for the base H including base H's exponent, theta, etc.

The sum level 1120 of the hierarchy 1100 has one or more sum processors, e.g., processors 1120AB, 1120 CD, through 1120 GH. Each of the sum processors 1120AB/1120 CD/through 1120 GH, sums the modulo values from one or more of the modulo processors on the level 1110.

One or more total sum processors 1135 in a total sum level 1130 sums the summed modulo values from the sum processors 1120AB/1120 CD/through 1120 GH on the sum level 1120 below.

Given this architecture, the total modulo value can be calculated efficiently in parallel. Other hierarchies 1100 and hierarchy levels 1110/1120/1130 are envisioned. In some embodiments, one or more of the processors in the hierarchies 1100 can use modulo tables to determine modulo values.

In some alternative embodiments, the system architecture 1100 is optimized, by not using modulo tables. For example, instead of recording the modulo tables, one or more specialized processor compute (1110A, B, C, D, G, H) the modulo for a given set of selected prime factors 140, for their respective bases, A-H. For example, by knowing the modulo relationships for given exponents, e.g., 2, 5, 10, 100, 1000, of the bases (A-H), the processors 1120/1130 can compute by summing the inodulos for each of these individually. For example, the "base 2 processor", 1110A, has a simpler example calculation of $2^{1076} \mod 1081 = (2^{1000} + 2^{70} + 2^{5} + 2) \mod 1081$. This operation can be carried by a specialized processor, e.g., 1110A, efficiently in one or two cycles. Accordingly, there can be a tradeoff is between between different architectures, e.g., those architectures using one or more specialized processors (1110A-1110H)

and less memory and those architectures using general purpose processors and modulo tables and more memoir.

In any event, when the total modulo, determined 1010 (in FIG. 10) by the hierarchy 1100, is zero, then the substring, SS, is within the LS 1020.

In a second optimized alternative embodiment, the encoding to primes, (each selected prime base and exponent), instead of recording the exponents on an integer (requires storage of 16, 32, 64 bits etc.), and so, there are number_of_bases multiplied by the size of an integer, where we need use only one integer, e.g., a form of further compression of the values. The value of this stored integer is such that the first 7 bits represent the exponent of the smallest base, the next 5 bits of the next base and 4 bits for each other exponents. This is because the exponent of the bases decreases at least quadratically. So, the overall space required by the encoding of the database is reduce 8 times.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A data structure comprising:
   a prime representation data structure on a network server, in a computer architecture, the prime representation data structure having a plurality of records, each record containing a prime representation, the prime representation being a product of two or more selected prime factors, each of the selected prime factors associated with an n-gram of a domain representation of a domain string, the domain representation of the domain string being a domain string of ordered, contiguous domain characters, and the n-gram being a subset of n number of the ordered, contiguous domain characters in the domain string; and
   a prime target query data structure, the prime target query data structure containing one or more target prime queries, each target prime query having one or more target selected prime factors, each target selected prime factor associated with a target n-gram of a target domain representation of a target domain string, wherein the target domain string is a short string (SS) in the domain.

2. The prime representation data structure, as in claim 1, where one or more of the prime factors is in a compressed format.

3. The prime representation data structure, as in claim 2, where the compressed format of one or more of the prime factors is an exponential form, the exponential form having a base and the base having an exponent.

4. The prime representation data structure, as in claim 3, one or more of the prime factors is a Euler totient of a prime number, where the base of the exponential form is chosen from a set of small prime numbers.

5. The prime representation data structure, as in claim 4, where the set of small prime numbers are a subset of the set of the first 15 prime numbers.

6. The prime representation data structure, as in claim 1, where the domain characters are selected from the group consisting of: a character of a natural language, a letter of a natural language, a representation of a character in a natural language, an "American Standard Code for Information Interchange" (ASCII) character, a number, and a phoneme of a natural language.

7. The prime representation data structure, as in claim 1, stored in a selection from the group consisting of: an internal computer memory, an external computer memory, a hard drive, a computer chip, a read only memory (ROM), a random-access memory (RAM), one or more memories distributed over a network, and a memory on a network server.

8. The prime representation data structure, as in claim 1, where one one or more of the prime representations are associated with a selection from the group consisting of:
   a public database, a literary work, a compendium of technical data, one or more documents on a network server a dictionary, a thesaurus, a natural language document translating a first word in a fist natural language to one or more second words in a second natural language, and a technical document translating a first functional description into a second functional description.

9. A string searching computer architecture comprising:
   one or more central processing units (CPUs) with one or more operating systems and one or more input/output device interfaces, one or more memories, and one or more input/output devices;
   a prime representation data structure on a network server, the prime representation data structure having a plurality of records, each record containing a prime representation, the prime representation being a product of two or more selected prime factors, each of the selected prime factors associated with an n-gram of a domain representation of a domain string, the domain representation of the domain string being a domain string of ordered, contiguous domain characters and the n-gram being a subset of n number of ordered, contiguous domain characters of the domain string;
   one or more prime target query data structures, the prime target query data structure containing one or more target prime queries, each target prime query having one or more target selected prime factors, each target selected prime factor associated with a target n-gram of a target domain representation of a target domain string, wherein the target domain string is a short string (SS) in the domain; and
   a search process performed by one or more of the CPUs to determine whether one or more of the target selected prime factors is common with one of the selected prime factors.

10. The string searching computer architecture, as in claim 9, where the domain representation is a large string (LS) in a domain.

11. The string search computer architecture, as in claim 10, where the SS is contained in the LS responsive to each of the target selected prime factors is common with at least one of the selected prime factors.

12. The string search computer architecture, as in claim 10, where the SS is contained in the LS responsive to the prime representation divided by the target selected prime factors has a modulo of zero.

13. The string searching computer architecture, as in claim 9, further comprising:
   a domain representation data structure with a plurality of domain records, the domain representation data structure stored in one or more of the memories, each of the domain records containing one or more of the domain representations;
   an n-gram process that creates one or more of the n-gram associated with one or more of the domain representations; and
   a mapping process that uniquely associates one of the selected prime factors with one of the n-grams and creates one of the prime representations of a corresponding domain representation by multiplying together each of the selected prime factors that is associated with one of the n-grams contained in the corresponding domain representation.

14. The string searching computer architecture, as in claim 9, further comprising a selected prime number data structure that stores a plurality of selected prime factors.

15. The string searching computer architecture, as in claim 14, where the each of the selected prime factors is selected to have a Euler's totient that can be defined in an exponential form, the exponential form being a base and an exponent, and where each of the bases is a small prime number.

16. The string searching computer architecture, as in claim 15, where each of the small prime numbers is selected from a subset of the first 15 prime numbers.

17. The string searching computer architecture, as in claim 9, where the mapping process performs the following steps instead:
   associating a first selected prime factor with each of the respective n-grams;
   associating a second prime factor with the respective n-gram;
   creating a first prime representations of a corresponding domain representation by multiplying together each of the first selected prime factors; and
   creating a second prime representations of a corresponding domain representation by multiplying together each of the second selected prime factors.

18. The string searching computer architecture, as in claim 9, where the prime representation data structure is stored in a selection from the group consisting of: an internal computer memory, an external computer memory, an external hard drive, a computer chip, a read only memory (ROM), a random-access memory (RAM), and a memory on a network server.

19. A method of creating a prime representation data structure on a network server, comprising the steps of:
   creating a plurality of prime records stored in one or more of the memories, wherein each record contains a prime representation, the prime representation being a product of two or more prime factors, each of the prime factors associated with an n-gram of a domain representation of a domain string, the domain representation of the domain string being a domain string of ordered, contiguous domain characters, and the n-gram being a n-gram subset of ordered, contiguous domain characters of the domain string, the n-gram being n number of domain characters in length, one or more prime target query data structures, the prime target query data structure containing one or more target prime queries, each target prime query having one or more target selected prime factors, each target selected prime factor associated with a target n-gram of a target domain representation of a target domain string, wherein the target domain string is a short string (SS) in the domain.

20. The method of claim 19, where the SS is contained in the LS responsive to each of the target selected prime factors is common with at least one of the selected prime factors.

* * * * *